(12) United States Patent
Chang

(10) Patent No.: US 8,071,968 B2
(45) Date of Patent: Dec. 6, 2011

(54) PHASE CHANGE MEMORY DEVICE AND METHOD FOR MANUFACTURING THE SAME

(75) Inventor: Heon Yong Chang, Suwon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 181 days.

(21) Appl. No.: 12/431,885

(22) Filed: Apr. 29, 2009

(65) Prior Publication Data
US 2010/0059731 A1    Mar. 11, 2010

(30) Foreign Application Priority Data
Sep. 5, 2008  (KR) .................. 10-2008-0087935

(51) Int. Cl.
*H01L 29/02* (2006.01)

(52) U.S. Cl. .. 257/2; 257/3; 257/4; 257/5; 257/E29.002; 438/102; 438/103; 365/163

(58) Field of Classification Search ................ 257/2–5, 257/E29.002; 438/102–103; 365/163
See application file for complete search history.

(56) References Cited

U.S. PATENT DOCUMENTS

| | | | |
|---|---|---|---|
| 7,667,219 B2 * | 2/2010 | Chang et al. | 257/4 |
| 2003/0183881 A1 * | 10/2003 | Lee et al. | 257/382 |
| 2007/0120106 A1 * | 5/2007 | Hayakawa et al. | 257/3 |
| 2007/0120107 A1 * | 5/2007 | Hayakawa | 257/4 |

FOREIGN PATENT DOCUMENTS

| | | |
|---|---|---|
| KR | 1020080078972 A | 8/2008 |
| KR | 1020090092410 A | 9/2009 |
| KR | 1020100009029 A | 1/2010 |
| KR | 1020100028958 A | 3/2010 |

* cited by examiner

*Primary Examiner* — Bradley K Smith
*Assistant Examiner* — Jami M Valentine
(74) *Attorney, Agent, or Firm* — Ladas & Parry LLP (57) ABSTRACT

A phase change memory device and a method of manufacturing the same are presented. The phase change memory device includes a silicon substrate, a first insulation layer, cell switching elements, heaters, a gate, a second insulation layer, a barrier layer, a phase change layer and top electrodes. The first insulation layer has first holes. The cell switching elements are in the first holes. The heaters are on the cell switching elements. The gate is higher than the cell switching elements. The second insulation layer having second holes which expose the heaters, and exposes a hard mask layer of the gate. The barrier layer is on sidewalls of the second holes and on the second insulation layer. The phase change layer is formed in and over the second holes in which the barrier layer is formed. The top electrodes are formed on the phase change layer.

20 Claims, 6 Drawing Sheets

PHASE CHANGE MEMORY DEVICE AND METHOD FOR MANUFACTURING THE SAME

CROSS-REFERENCE TO RELATED APPLICATIONS

The present application claims priority to Korean patent application number 10-2008-0087935 filed on Sep. 5, 2008, which is incorporated herein by reference in its entirety.

BACKGROUND OF THE INVENTION

The present invention relates to a phase change memory device and a method for manufacturing the same, and more particularly, to a phase change memory device which can prevent or inhibit the deterioration of transistor characteristics formed in a peripheral region and a method for manufacturing the same.

In general, memory devices are generally divided into volatile RAMs (random access memory) that loses inputted information when power is interrupted and non-volatile ROMs (read-only memory) that maintain the stored state of inputted information even when power is interrupted. As to volatile RAMs, a DRAM (dynamic RAM) and an SRAM (static RAM) can be mentioned. As to non-volatile ROMs, a flash memory device such as an EEPROM (electrically erasable and programmable ROM) can be mentioned.

While the DRAM belongs to an excellent memory device, the DRAM must have high charge storing capacity. To this end, since the surface area of an electrode must be increased, it is difficult to accomplish a high level of integration with DRAMs. Further, in the flash memory devices, due to the fact that two gates are stacked on each other, a high operation voltage is required as compared to a power supply voltage. According for flash memory devices, a separate booster circuit is needed to generate a voltage needed for write and delete operations. Therefore for flash memory devices it is also difficult to achieve a high level of integration.

Under these situations, much research has been undertaken with the hopes of developing alternate novel memory devices that still retain simple configurations and are able to achieve a high level of integration while retaining the desirable characteristics of non-volatile memory devices. As one example, a phase change memory device has been disclosed in the art. The operational basis of phase change memory device is that a phase change layer is interposed between a bottom electrode and a top electrode. The phase change layer can be in a crystalline state to an amorphous state which can be brought about by imposing a current flow between the bottom electrode and the top electrode. Accordingly, the information can be stored in a phase change memory cell by exploiting the physical phenomenon of the difference in resistance between the crystalline state and the amorphous state.

One of the most important factors that must be considered to develop a phase change memory device is to reduce or minimize programming current. Accordingly, recent phase change memory devices adopt vertical PN diodes, having high current flow rate, as cell switching elements in place of NMOS transistors. When the vertical PN diodes are adopted, because the vertical PN diodes have increased current flow rate and the size of cells can be decreased, it is possible to realize a highly integrated phase change memory device.

While not shown in a drawing, phase change memory devices can employ the vertical PN diodes, as cell switching elements. The vertical PN diodes are formed in a cell region after forming gates in a peripheral region. Due to this fact, the vertical PN diodes cannot but be formed higher than the gates. Accordingly, defects are likely to be caused in the transistors which are formed in the peripheral region.

In order to form the vertical PN diodes, in the conventional art, after defining holes in an insulation layer, an epi-silicon layer is formed in the holes through a selective epitaxial growth (SEG) process. Then, N-type and P-type impurities are ion-implanted into the epi-silicon layer. In this regard, since the epi-silicon layer is formed higher than the gates formed in the peripheral region, when conducting the SEG process as a high temperature process, impurities ion-implanted into the source and drain areas of the transistors in the peripheral region diffuse. As a result, a problem is caused in that the characteristics of the transistors in the peripheral region deteriorate.

Meanwhile, in order to reduce the programming current of a phase change memory device, it is necessary to decrease the contact interface between each heater and a phase change layer. This can be accomplished by decreasing the size of the heater. However, since the size distribution of the holes in which heaters are to be formed cannot but be wide due to the limitations in a lithography process, programming current distribution also becomes wide. As a consequence, it is difficult to secure the characteristics of the phase change memory device.

In phase change memory devices, current flow from the cell switching elements is transmitted to the phase change layer through the heaters. If the size of the heaters is decreased so as to reduce the programming current of the phase change memory device, when reset programming is performed, that is, when the phase change layer is quenched after being melted, heat transfer to the heaters does not quickly occur. As a result nucleation is caused in the phase change layer, and reset resistances cannot be produced at a high level. As a result, the difference between reset resistance and set resistance is not substantial enough for an adequate sensing margin to be exploited in which durability characteristics are likely to degrade.

SUMMARY OF THE INVENTION

Embodiments of the present invention are directed to a phase change memory device which can prevent the characteristics of transistors formed in a peripheral region from deteriorating due to formation of vertical PN diodes and a method for manufacturing the same.

Also, embodiments of the present invention are directed to a phase change memory device which can improve programming current distribution and a method for manufacturing the same.

Further, embodiments of the present invention are directed to a phase change memory device which can secure a sensing margin and durability and a method for manufacturing the same.

In one aspect of the present invention, a phase change memory device comprises a silicon substrate having a cell region and a peripheral region; a first insulation layer formed in the cell region of the silicon substrate and having first holes; cell switching elements formed in the first holes; heaters formed on the cell switching elements; a gate formed in the peripheral region of the silicon substrate and having a stack structure of a gate insulation layer, a first conductive layer, a second conductive layer and a hard mask layer, the gate being formed higher than the cell switching elements formed in the cell region; a second insulation layer having second holes which expose the heaters formed in the cell region, and defined to expose the hard mask layer of the gate formed in the peripheral region; a barrier layer formed on sidewalls of the second holes and on the second insulation layer; a phase change layer formed in and over the second holes in which the barrier layer is formed; and top electrodes formed on the phase change layer.

The phase change memory device may further comprise an N+ base area formed in a surface of the silicon substrate in the cell region.

The cell switching elements comprise vertical PN diodes having a structure in which an N-type silicon layer and a P-type silicon layer are stacked.

The N-type silicon layer may have a doping concentration of about $1 \times 10^{18} \sim 1 \times 10^{20}$ ions/cm$^3$.

The P-type silicon layer may have a doping concentration of about $1 \times 10^{20} \sim 1 \times 10^{22}$ ions/cm$^3$.

The cell switching element and the first conductive layer including the gate insulation layer may have the same height when viewed in respective sections.

The first conductive layer may be formed of polysilicon.

The heater and the second conductive layer may have substantially the same height when viewed in their respective sections.

The heaters and the second conductive layer are formed of any one of W, Cu, Al and WSi.

The phase change memory device may further comprise gate spacers formed on both sidewalls of the gate.

The second holes may have a size of about 10~100 nm.

The barrier layer is composed of the hard mask layer which remains on the sidewalls of the second holes and a third insulation layer which is formed on the second insulation layer.

The hard mask layer and the third insulation layer can be composed of nitride layers.

The phase change memory device may further comprise spacers interposed between the barrier layer formed on the sidewalls of the second holes and the phase change layer.

The spacers can be composed of at least one of an oxide layer and a nitride layer.

The phase change layer is formed in the second holes and over the second insulation layer.

The phase change layer has a pore shaped structure by filing in a hole.

The phase change layer is formed of a compound containing at least one of Ge, Sb and Te.

The phase change layer is ion-implanted with at least one of oxygen, nitrogen and silicon.

The top electrodes are formed of any one of TiN, TiW, TiAlN and WN.

The phase change layer and the top electrodes are formed in lines.

In another aspect of the present invention, a method for manufacturing a phase change memory device comprises the steps of forming a first insulation layer having first holes in a cell region of a silicon substrate which has the cell region and a peripheral region; sequentially forming a gate insulation layer and a first conductive layer in the peripheral region of the silicon substrate to have the same height as the first insulation layer; forming cell switching elements in the first holes in the cell region; sequentially forming a second conductive layer and a hard mask layer on the first insulation layer including the cell switching elements and on the first conductive layer; forming a gate by etching the hard mask layer, the second conductive layer, the first conductive layer and the gate insulation layer which are formed in the peripheral region; forming heaters, which comprise the second conductive layer, on the cell switching elements by etching the hard mask layer and the second conductive layer in the cell region; forming a second insulation layer on the first insulation layer and on the silicon substrate in the peripheral region to expose the hard mask layer on the heaters and the hard mask layer of the gate; forming a third insulation layer on the second insulation layer; defining second holes by etching the third insulation layer and the hard mask layer on the heaters in such a way as to expose the heaters, and forming a barrier layer on sidewalls of the second holes and the second insulation layer; and forming stack patterns of a phase change layer and a top electrode on the third insulation layer including the second holes.

The method may further comprise the step of forming an N+ base area in a surface of the silicon substrate in the cell region before to the step of forming the first insulation layer.

The cell switching elements comprise vertical PN diodes.

The step of forming the cell switching elements in the first holes comprises the steps of forming an N-type silicon layer in the first holes; and forming a P-type silicon layer by ion-implanting P-type impurities in an upper portion of the N-type silicon layer.

The step of forming the N-type silicon layer is implemented through a selective epitaxial growth process.

The N-type silicon layer is formed to have a doping concentration of about $1 \times 10^{18} \sim 1 \times 10^{20}$ ions/cm$^3$.

The P-type silicon layer is formed by implanting P-type impurities with energy of about 10~100 keV to have a doping concentration of about $1 \times 10^{20} \sim 1 \times 10^{22}$ ions/cm$^3$.

The first conductive layer is formed of polysilicon.

The method may further comprise the step of forming gate spacers on both sidewalls of the gate, after the step of forming the gate and before the step of forming the heaters.

The second conductive layer including the heaters is formed of any one of W, Cu, Al and WSi.

The hard mask layer comprises a nitride layer.

The second holes are defined to have a size of about 10~100 nm.

The third insulation layer comprises a nitride layer.

The method may further comprise the step of forming spacers on portions of the barrier layer which is formed on the sidewalls of the second holes, after the step of forming the barrier layer and before the step of forming the stack patterns of the phase change layer and the top electrode.

The spacers comprise at least one of a nitride layer and an oxide layer.

The step of forming the stack patterns of the phase change layer and the top electrode comprises the steps of forming a phase change material layer on the barrier layer including the second holes; forming a conductive layer for top electrodes on the phase change material layer; and etching the conductive layer for top electrodes and the phase change material layer.

The phase change layer is formed in the second holes and over the second insulation layer.

The phase change layer may have a pore shaped structure when filling in a cylindrical hole.

The phase change layer is formed of a compound containing at least one of Ge, Sb and Te.

The phase change layer is formed by ion-implanting at least one of oxygen, nitrogen and silicon.

The top electrode is formed of any one of TiN, TiW, TiAlN and WN.

The stack patterns of the phase change layer and the top electrode are formed in lines.

DESCRIPTION OF SPECIFIC EMBODIMENTS

Hereafter, specific embodiments of the present invention will be described in detail with reference to the accompanying drawings.

Figure 1:
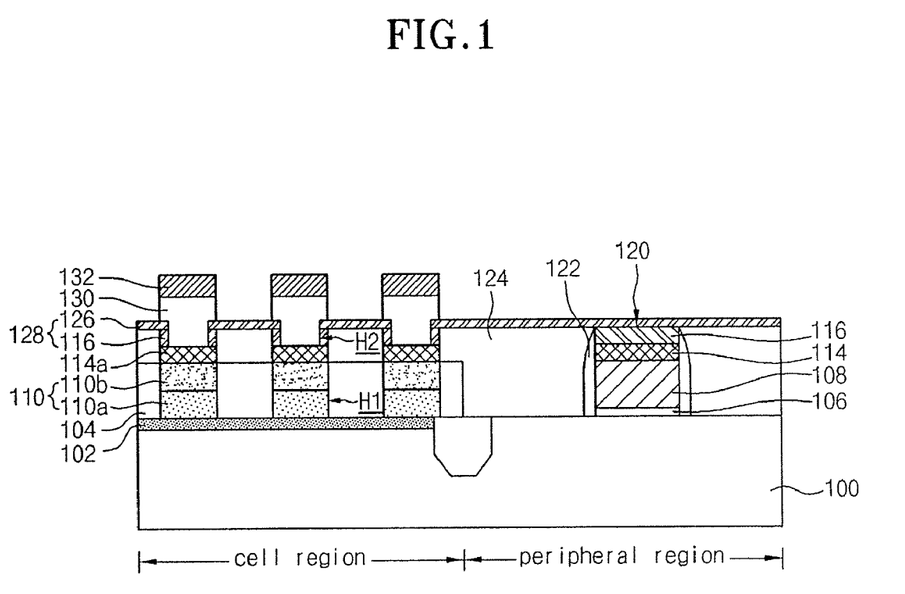
FIG. 1 is a sectional view illustrating a phase change memory device in accordance with a first embodiment of the present invention.

FIG. 1 is a sectional view illustrating a phase change memory device in accordance with a first embodiment of the present invention.

Referring to FIG. 1, a silicon substrate 100 compartmented into a cell region, which includes a plurality of cell areas, and a peripheral region, in which driving circuits are to be formed, is prepared. An N+ base area 102 is formed in the surface of the cell region of the silicon substrate 100. The N+ base area 102 can be understood as being formed in the surfaces of active areas which are delimited by an isolation structure in the cell region. The N+ base area 102 is formed to electrically connect vertical PN diodes 110 serving as cell switching elements with word lines (not shown).

A first insulation layer 104 is formed on the cell region of the silicon substrate 100, including the N+ base area 102. The vertical PN diodes 110 serving as cell switching elements are formed in first holes H1 defined in portions of the first insulation layer 104 which correspond to respective cell areas. Each vertical PN diode 110 has the stack structure such that an N-type silicon layer 110a is stacked underneath a P-type silicon layer 110b. Heaters 114a are formed on the respective vertical PN diodes 110. The heaters 114a are formed wide when compared to a phase change memory device having a normal stack structure. The heaters 114a are formed of a metallic material having excellent heat transfer capability, for example, using any one of W, Cu, Al, and WSi, so that heat transfer from a phase change layer can quickly occur.

A transistor (not shown), that includes a gate 120 and junction areas (not shown), is formed as a driving circuit in the peripheral region of the silicon substrate 100. The gate 120 is composed of the stack structure containing a gate insulation layer 106, a first conductive layer 108, a second conductive layer 114, and a hard mask layer 116. The first conductive layer 108 is formed of polysilicon. When viewing the section of the first conductive layer 108 including the gate insulation layer 106, the first conductive layer 108 has substantially the same height as the first insulation layer 104 of the cell region. The second conductive layer 114 is formed at substantially the same level as the heaters 114a of the cell region. The second conductive layer 114 can be formed of any one of W, Cu, Al and WSi. The hard mask layer 116 is composed of a nitride layer. The gate 120 is formed to have a height greater than the vertical PN diodes 110 in which the vertical PN diodes 110 are formed as cell switching elements in the cell region. The gate 120 is formed after forming the vertical PN diodes 110. Gate spacers 122 are formed on both sidewalls of the gate 120.

A second insulation layer 124 is formed on the overall surface of the silicon substrate 100 that includes the cell region formed with the heaters 114a and the peripheral region formed with the gate 120. The second insulation layer 124 has second holes H2 which expose the heaters 114a of the cell region, and is formed to expose the hard mask layer 116 of the gate 120 formed in the peripheral region. The second holes H2 have a size no greater than about 100 nm, preferably, of about 10~100 nm.

A barrier layer 128 is formed on the sidewalls of the second holes H2 and on the second insulation layer 124 including the hard mask layer 116 of the gate 120. The barrier layer 128 functions to prevent or to inhibit Joule's heat transferred from the heaters 114a to the phase change layer from being dissipating. The barrier layer 128 also functions to prevent or to inhibit the thickness of the hard mask layer 116 of the gate 120 formed in the peripheral region from decreasing while subsequently conducting a CMP (chemical mechanical polishing) process. The barrier layer 128 has substantially the same level as the hard mask layer 116 of the gate 120. The barrier layer 128 includes the hard mask layer 116 that is formed on the sidewalls of the second holes H2 and a third insulation layer 126 that is formed on the second insulation layer 124 which includes the hard mask layer 116. The third insulation layer 126 can be composed of, for example, a nitride layer.

A phase change layer 130 is formed to substantially fill in the second holes H2 in which the hard mask layer 116 is formed. The top electrodes 132 are formed on the phase change layer 130. The phase change layer 130 has a pore structure in that it contacts the heaters 114a in the second holes H2. The phase change layer 130 projects out of the second holes H2 to be placed higher relative to the second insulation layer 124 including the barrier layer 128. The stack patterns of the phase change layer 130 and the top electrode 132 are formed, for example, in the type of lines which extend along a direction substantially perpendicular to the extending direction of the N+ base area 102.

While not shown in a drawing, a fourth insulation layer is formed on the barrier layer 128 including the stack patterns of the phase change layer 130 and the top electrode 132. Bit lines (not shown) are formed on the fourth insulation layer to be connected with the top electrodes 132 through top electrode contacts. A fifth insulation layer is formed on the fourth insulation layer to cover the bit lines. Word lines (not shown) are formed on the fifth insulation layer to be electrically connected with the N+ base area 102 through contacts.

In the phase change memory device according to the first embodiment of the present invention, since the vertical PN diodes of the cell region are formed lower and earlier than the gate of the peripheral region, it is possible to prevent or inhibit the characteristics of the transistor formed in the peripheral region from deteriorating.

Further, in the phase change memory device according to the first embodiment of the present invention, because the phase change layer is formed to have a pore structure in that it contacts the heaters in the second holes, programming current can be reduced and programming current distribution can also be narrowed. Moreover, since heat transfer can more rapidly occur to the heaters when the phase change layer is quenched, the amorphous phase of the phase change layer can be more rapidly stably formed. Also the difference between reset resistance and set resistance can be increased, whereby a sensing margin can be increased and durability of the phase change memory device can be improved.

FIGS. 2A through 2H are sectional views illustrating the processes of a method for manufacturing the phase change memory device in accordance with the first embodiment of the present invention. The method will be described below.

Figure 2A:
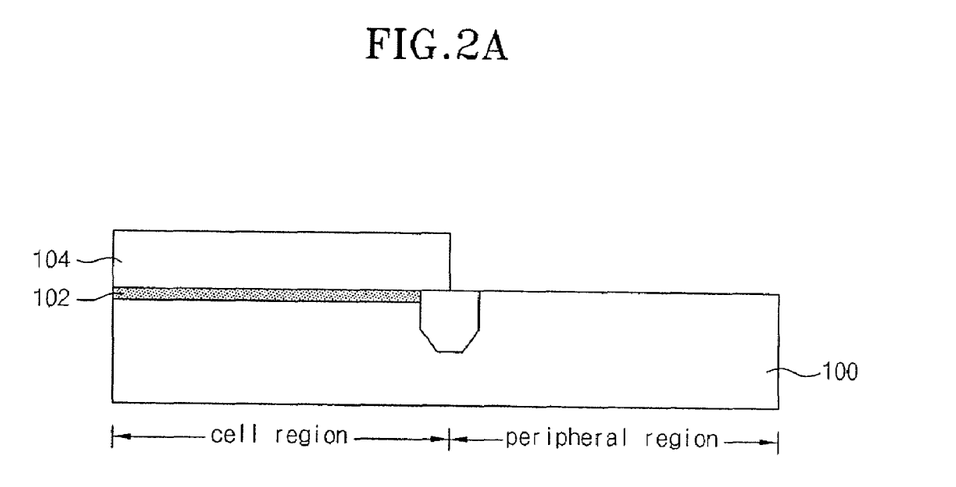
FIGS. 2A through 2H are sectional views illustrating the processes of a method for manufacturing the phase change memory device in accordance with the first embodiment of the present invention.

Referring to FIG. 2A, an isolation structure is formed in a silicon substrate 100 which has a cell region and a peripheral region, to delimit active areas in the respective regions. By ion-implanting N-type impurities in the surfaces of the active areas in the cell region, an N+ base area 102 is formed. After forming a first insulation layer 104 on the overall surface of the silicon substrate 100 including the N+ base area 102, the portion of the first insulation layer 104 which is formed in the peripheral region is removed using a process well known in the art.

Figure 2B:
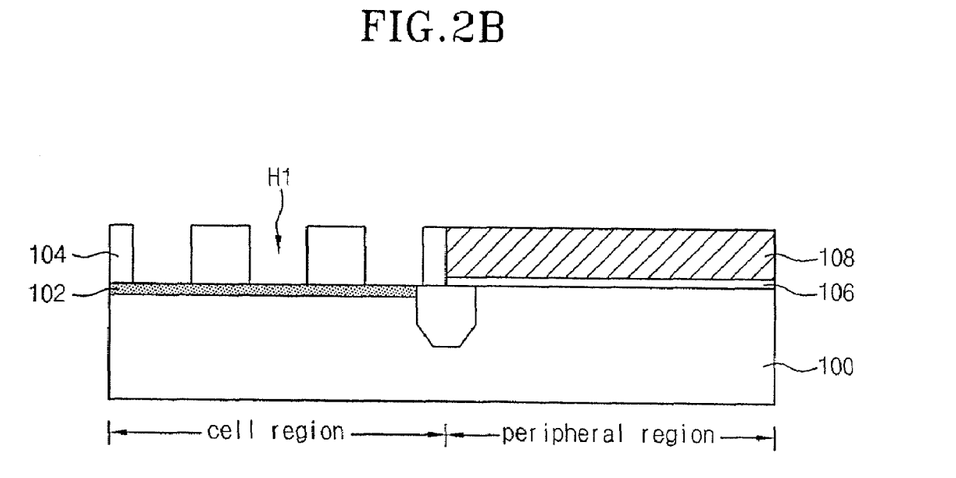

Referring to FIG. 2B, a gate insulation layer 106 is formed in the peripheral region of the silicon substrate 100 from which the first insulation layer 104 is removed, for example, by using a thermal oxidation process. After depositing a first conductive layer 108 composed of polysilicon on the gate insulation layer 106, then the first insulation layer 104, and the first conductive layer 108 is polished using a CMP process until the first insulation layer 104 is exposed. By selectively etching the first insulation layer 104 formed in the cell region, a plurality of first holes H1 are defined. The first holes H1 are defined and placed at positions corresponding to respective phase change cell areas in the cell region.

Figure 2C:
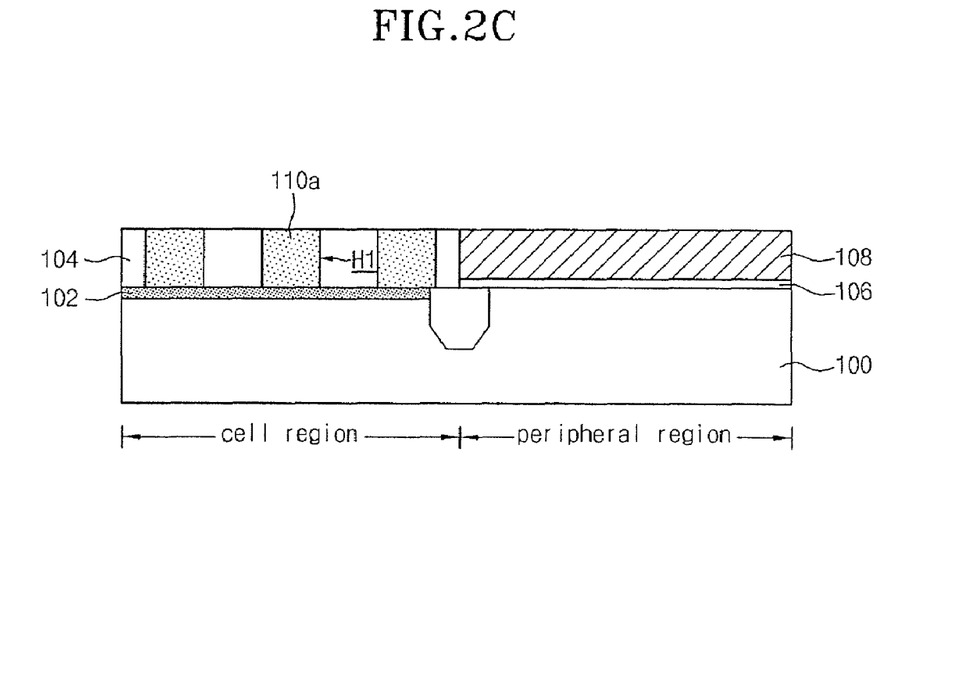

Referring to FIG. 2C, an N-type silicon layer 110a is grown in the first holes H1 by using a SEG (Selective epitaxial growth) process. Subsequently the portion of the N-type silicon layer 110a that is formed out of the first insulation layer 104 is then removed using a CMP process. The N-type silicon layer 110a is formed so that N-type impurities, such as P and As, are at a doping concentration of about $1\times10^{18}\sim1\times10^{20}$ ions/cm$^3$.

Figure 2D:
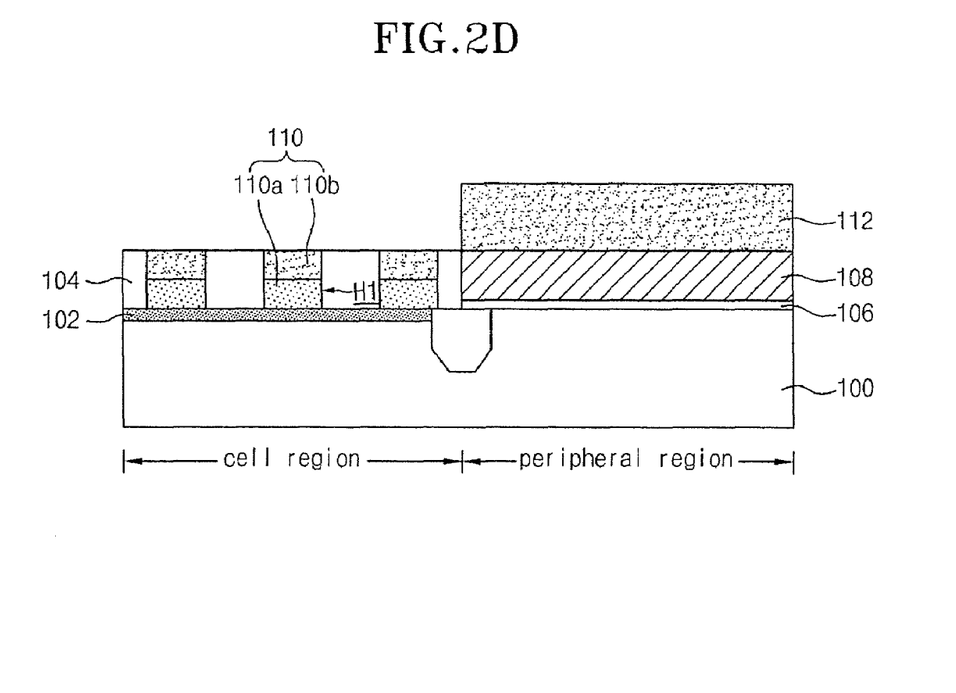

Referring to FIG. 2D, an ion implantation mask 112 comprising, for example, a photoresist pattern, is then formed on the first conductive layer 108 in the peripheral region. By ion-implanting P-type impurities into the upper portions of the N-type silicon layer 110a which is formed in the first holes H1 which are exposed through the ion implantation mask 120, a P-type silicon layer 110b is formed. By doing this, vertical PN diodes 110, which are composed of the stack structure of the N-type silicon layer 110a and the P-type silicon layer 110b, are formed in the first holes H1 and these vertical PN diodes 110 can be used as cell switching elements. The P-type silicon layer 110b is formed by implanting B or BF$_2$ ions with energy of about 10~100 keV to establish a doping concentration of about $1\times10^{20}\sim1\times10^{22}$ ions/cm$^3$.

Figure 2E:
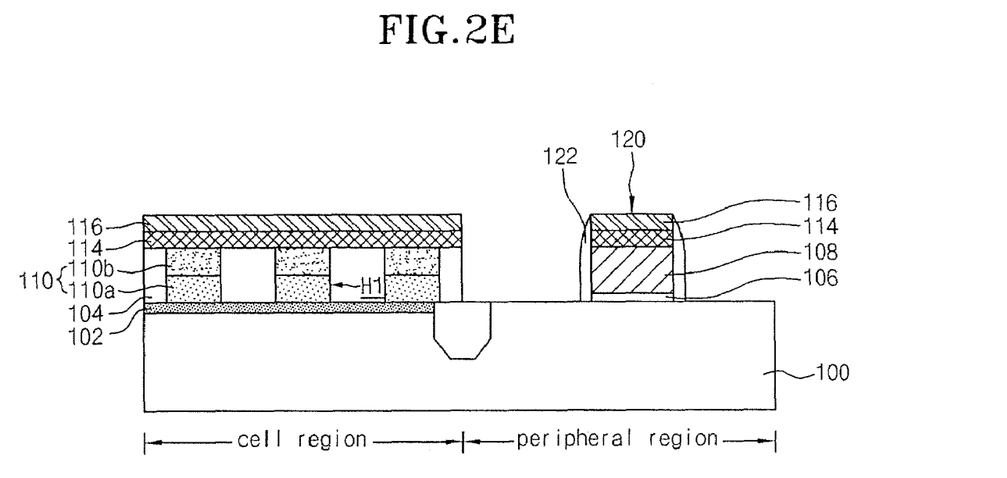

Referring now to FIG. 2E, the ion implantation mask 112 is then removed by using a process well known in the art. Next, a second conductive layer 114 and a hard mask layer 116 are sequentially formed on the first insulation layer 104 including the PN diodes 110 of the cell region and on the first conductive layer 108 of the peripheral region. The formed second conductive layer 114 is composed of any one of W, Cu, Al and WSi, and the hard mask layer 116 may be composed of a nitride layer.

After forming a gate 120 by selectively etching the hard mask layer 116, then the second conductive layer 114, the first conductive layer 108 and the gate insulation layer 106 are formed in the peripheral region, and gate spacers 122 composed of at least one of an oxide layer and a nitride layer are formed on both sidewalls of the gate 120. Junction areas (not shown) are then formed in the surface of the silicon substrate 100 on both sides of the gate 120 including the gate spacers 122. By doing this, a transistor (not shown) is formed in the peripheral region which can be used as part of a driving circuit (not shown).

Figure 2F:
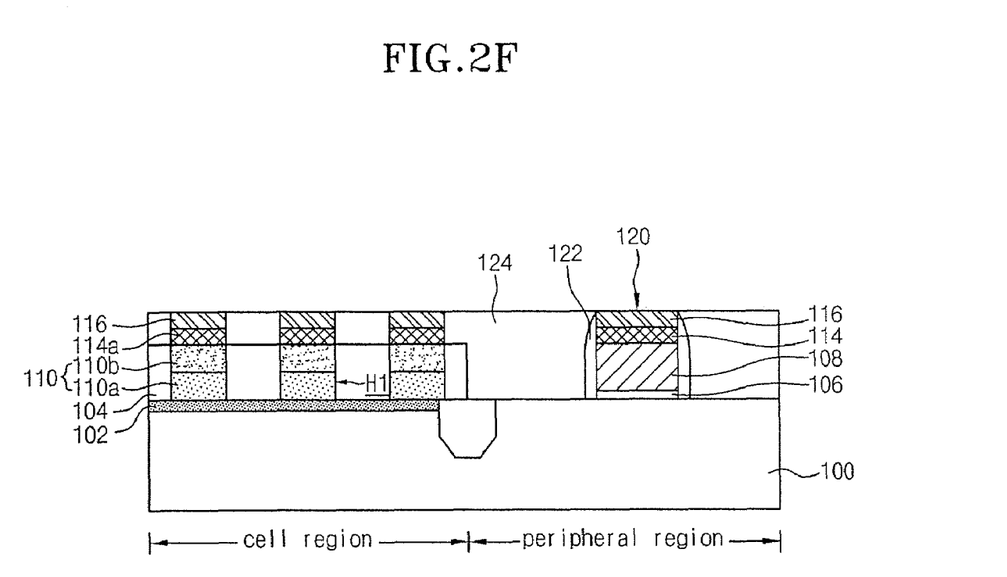

Referring to FIG. 2F, by selectively etching the hard mask layer 116 and the second conductive layer 114 which remain in the cell region, heaters 114a comprising the second conductive layer 114 are subsequently formed coaxially on their respective vertical PN diodes 110 in the cell region. The heaters 114a can be composed of any one of W, Cu, Al and WSi as the material of the second conductive layer 114. Accordingly, the hard mask layer 116 remains on the heaters 114a.

A second insulation layer 124 is formed on the overall surface of the silicon substrate 100 including the cell region in which the heaters 114a are formed and the peripheral region in which the gate 120 is formed. Thereupon, the second insulation layer 124 is polished using a CMP process until the hard mask layer 116 on the heaters 114a and the hard mask layer 116 of the gate 120 are exposed.

Figure 2G:
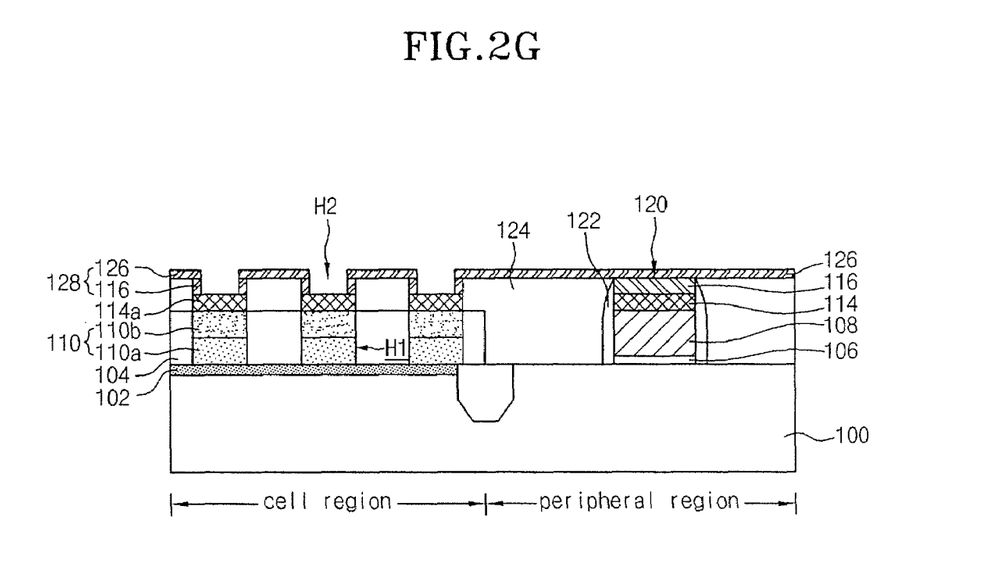

Referring to FIG. 2G, a third insulation layer 126 is then formed on the second insulation layer 124 including the exposed hard mask layer 116. The third insulation layer 126 can be composed of, for example, a nitride layer. Second holes H2 are defined by selectively etching the third insulation layer 126 and the hard mask layer 116 on the heaters 114a to expose the heaters 114a. By doing this, a barrier layer 128, which is composed of the hard mask layer 116 and the third insulation layer 126, is formed. The barrier layer 128 is formed to prevent or inhibit the Joule's heat transferred from the heaters 114a to a phase change layer from being subsequently dissipating to the outside. The second holes H2 are sized no greater than about 100 nm, preferably, of about 10~100 nm. Accordingly, the area of the interfaces between the heaters 114a and the phase change layer can be decreased when subsequently formed.

Figure 2H:
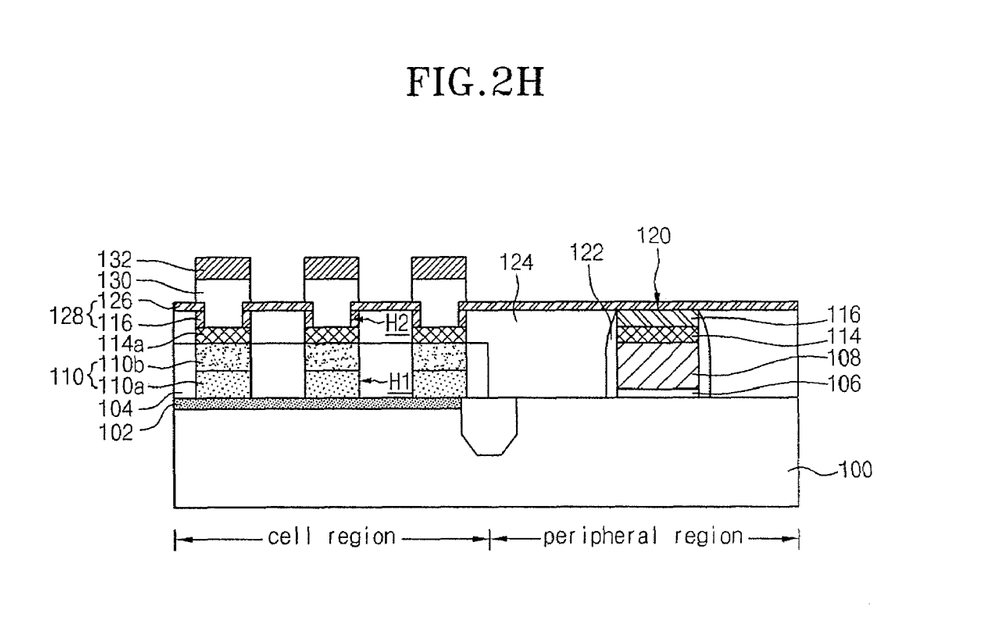

Referring to FIG. 2H, after depositing a thick phase change material layer on the barrier layer 128 that fills up the second holes H2, a conductive layer for top electrodes is then deposited on the phase change material layer. Then, by selectively etching the conductive layer and the phase change material layer, the stack patterns of the phase change layer 130 and the top electrode 132 are then formed. The stack patterns of the phase change layer 130 and the top electrode 132 can be formed as lines which extend in a direction substantially perpendicular relative to the extending direction of the N+ base area 102. The phase change layer 130 is not only formed to fill the second holes H2 but also formed to project out of the second insulation layer 124 including the barrier layer 128.

Since the phase change layer 130 has a pore structure due to filling in the second holes H2, a phase change occurs in the middle portion of the second holes H2 when current flows from the heaters 114a. Because the volume change is reduced, the characteristics of the interfaces of the heaters 114a can be improved. In particular, since the phase change layer 130 has the pore structure, the dissipation of the Joule's heat transferred from the heaters 114a can be suppressed, and programming current can be reduced. According it is not necessary to define the second holes H2 to have a size within a lithography limit, and therefore a process margin can be increased.

The phase change layer 130 is formed of a compound containing at least one of Ge, Sb and Te as Chalcogenide materials. Also, the phase change layer 130 is doped with at least one of oxygen, nitrogen and silicon as impurities. The top electrodes 132 are composed of any one of TiW, TiAlN, TiN and WN.

Next, while not shown in a drawing, after forming a fourth insulation layer to cover the barrier layer 128 including covering the stack patterns of the phase change layer 130 and the top electrode 132, bit lines are formed on the fourth insulation layer to be connected with the top electrodes 132. Then, after forming a fifth insulation layer to cover the bit lines, word lines are formed on the fifth insulation layer to be electrically connected with the N+ base area 102. Thereafter, by sequentially conducting a series of well-known subsequent processes, the manufacture of the phase change memory device in accordance with the first embodiment of the present invention is completed.

As is apparent from the above description, in the present invention, due to the fact that cell switching elements constituted by vertical PN diodes are formed earlier than a gate of a peripheral region, it is possible to prevent the characteristics of a transistor formed in the peripheral region from deteriorating in the course of forming the vertical PN diodes.

Also, in the present invention, by forming heaters using a gate material, the area of the heaters can be increased, and according to this, heat transfer to the heaters can quickly occur. As a consequence, because it is possible to prevent nucleation from occurring in the phase change layer, a reset state of high resistance can be formed.

In addition, in the present invention, due to the fact that a phase change layer is formed to have a pore structure in which it is filled in holes, the characteristics of the interfaces between heaters and the phase change layer can be improved. According to this, because it is possible to prevent or inhibit Joule's heat transferred from the heaters from dissipating to the outside, programming current can be reduced. In particular, since the amorphous phase of the phase change layer can be stably formed, a reset state of high resistance can be achieved. As a result, as the difference between reset resistance and set resistance becomes substantially larger, and as a result a sensing margin can be increased, and as a consequence the durability of the phase change memory device can be improved.

Figure 3:
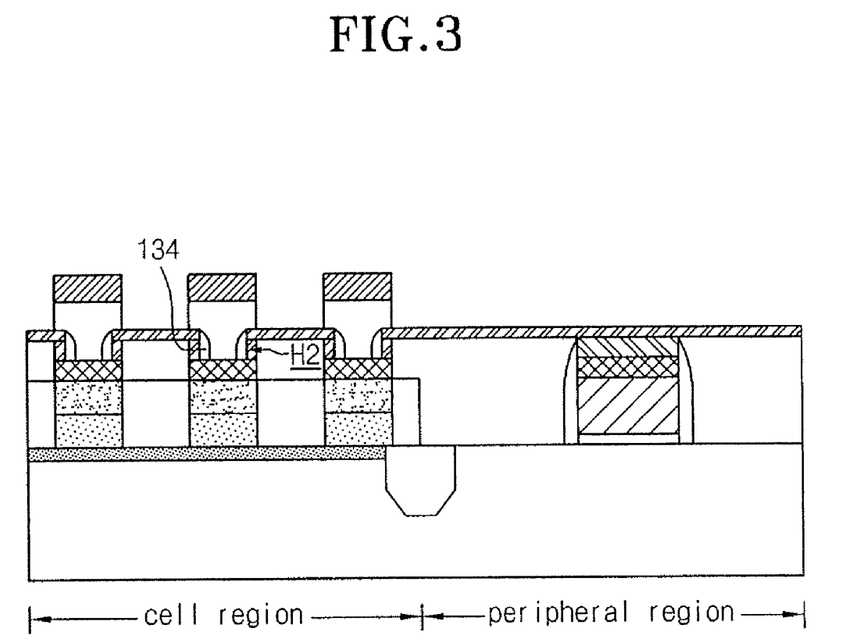
FIG. 3 is a sectional view illustrating a phase change memory device in accordance with a second embodiment of the present invention.

FIG. 3 is a sectional view illustrating a phase change memory device in accordance with a second embodiment of the present invention.

Referring to FIG. 3, in the phase change memory device according to the present embodiment, spacers 134 are formed on the sidewalls of the second holes H2 in which the barrier layer is formed, so that the area of the interfaces between the heaters 114a and the phase change layer 130 can be further decreased. The spacers 134 can be composed of an oxide layer or a nitride layer.

In the present embodiment of the invention, the other component elements except the formation of the spacers 134 are the same as those of the aforementioned embodiment, and therefore, detailed description thereof will be omitted herein.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A phase change memory device comprising: a silicon substrate having a cell region and a peripheral region;
   a first insulation layer formed in the cell region of the silicon substrate and having first holes;
   cell switching elements formed in the first holes; heaters formed on the cell switching elements; a gate formed in the peripheral region of the silicon substrate and having a gate insulation layer, a first conductive layer stacked on the gate insulation layer, a second conductive layer stacked on the first conductive layer and a hard mask layer stacked on the second conductive layer, the gate being formed higher than the cell switching elements formed in the cell region;
   a second insulation layer having second holes which expose the heaters formed in the cell region, and the second insulation layer exposes the hard mask layer of the gate formed in the peripheral region;
   a barrier layer formed on sidewalls of the second holes and on the second insulation layer;
   a phase change layer formed in and over the second holes in which the barrier layer is formed; and
   top electrodes formed on the phase change layer,
   wherein the cell switching elements comprise vertical PN diodes having a P-type silicon layer stacked on top of an N-type silicon layer.

2. The phase change memory device according to claim 1, further comprising an N+ base area in a surface of the silicon substrate in the cell region.

3. The phase change memory device according to claim 1, wherein the N-type silicon layer has a doping concentration of about $1\times10^{18}\sim1\times10^{20}$ ions/cm$^3$.

4. The phase change memory device according to claim 1, wherein the P-type silicon layer has a doping concentration of about $1\times10^{20}\sim1\times10^{22}$ ions/cm$^3$.

5. The phase change memory device according to claim 1, wherein the cell switching element and the first conductive layer including the gate insulation layer have substantially the same height.

6. The phase change memory device according to claim 1, wherein the first conductive layer is formed of polysilicon.

7. The phase change memory device according to claim 1, wherein the heater and the second conductive layer have substantially the same height.

8. The phase change memory device according to claim 1, wherein the heaters and the second conductive layer are formed of any one of W, Cu, Al and WSi.

9. The phase change memory device according to claim 1, further comprising gate spacers formed on both sidewalls of the gate.

10. The phase change memory device according to claim 1, wherein the second holes are size about 10~100 nm.

11. The phase change memory device according to claim 1, wherein the barrier layer is composed of the hard mask layer which remains on the sidewalls of the second holes and a third insulation layer which is formed on the second insulation layer.

12. The phase change memory device according to claim 11, wherein the hard mask layer and the third insulation layer are composed of nitride layers.

13. The phase change memory device according to claim 1, further comprising spacers between the barrier layer and the phase change layer.

14. The phase change memory device according to claim 13, wherein the spacers composed of at least one of an oxide layer and a nitride layer.

15. The phase change memory device according to claim 1, wherein the phase change layer is formed in the second holes and over the second insulation layer.

16. The phase change memory device according to claim 1, wherein the phase change layer has a pore structure.

17. The phase change memory device according to claim 1, wherein the phase change layer is formed of a compound containing at least one of Ge, Sb and Te.

18. The phase change memory device according to claim 17, wherein the phase change layer is ion-implanted with at least one of oxygen, nitrogen and silicon.

19. The phase change memory device according to claim 1, wherein the top electrodes are composed of any one of TiN, TiW, TiAlN and WN.

20. The phase change memory device according to claim 1, wherein the phase change layer and the top electrodes are formed as lines.

* * * * *